QUANTUM INTERFERENCE DEVICE

Filed April 2, 1965 2 Sheets-Sheet 1

JOHN J. LAMBE
ARNOLD H. SILVER
INVENTORS

BY John L. Faulkner
Thomas H. Oster
ATTORNEY

Jan. 9, 1968 J. J. LAMBE ETAL 3,363,211

QUANTUM INTERFERENCE DEVICE

Filed April 2, 1965 2 Sheets-Sheet 2

JOHN J. LAMBE
ARNOLD H. SILVER
INVENTORS

BY John R. Faulkner
Thomas H. Oster
ATTORNEYS

United States Patent Office 3,363,211
Patented Jan. 9, 1968

3,363,211

QUANTUM INTERFERENCE DEVICE

John J. Lambe, Birmingham, and Arnold H. Silver, Farmington, Mich., assignors to Ford Motor Company, Dearborn, Mich., a corporation of Delaware Filed Apr. 2, 1965, Ser. No. 445,129
3 Claims. (Cl. 338—32)

ABSTRACT OF THE DISCLOSURE

An electrical junction for use in a superconductor quantum interference device in which a relatively weak link is provided between two superconductive elements. This electrical junction comprises a first superconductive element and a second superconductive element separated by a perforated, insulating layer with one of the superconducting elements or layers extending through the perforated, insulating layer and into contact with the other superconducting element. This forms an electrical junction that is useful in various superconducting electrical devices including modulators and interferometers.

This invention is concerned with a process, system and apparatus for the control or modulation of electric currents in solid super-conductors. This invention is based upon the universal quantum wave properties of current carrying electrons in solids. Interference techniques operable upon all wave phenomena are employed to control or modulate the flow of electrons in a current carrying super-conductor. This invention is carried out by causing a relative phase displacement between at least two currents flowing through a super-conductor and combining these two currents after phase displacement has been achieved to obtain control or modulation of the current.

When two or more waves are brought together and caused to combine, the amplitude of the resulting wave depends upon the relative phase and amplitude of the combining waves. For the sake of clarity this discussion will be limited to the case of combining only two waves and that these waves be of the same original amplitude. It is to be recognized that this is only a very special case and the same logic and principles can be applied to the combination of any desired number of waves of any desired relative phase and amplitude.

In the event the two waves mentioned above combine "in phase" the amplitude of the resulting wave is larger than either of the initial waves. Similarly, if the waves combine "out of phase" the resulting wave may have a zero amplitude. These two situations are the two extreme cases and all intermediate situations are possible with an intermediate amplitude and a corresponding shift in phase.

This situation may be described mathematically in connection with FIGURE 1 which is a purely schematic showing of a super-conductive current path comprising two essentially parallel electrical paths.

Figure 1:
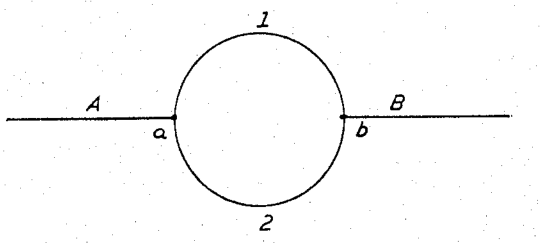

With reference to FIGURE 1, a wave (electrical current or electron flow) is caused to flow down path A and at (*a*) splits into two waves which flow along superconductive paths 1 and 2 and are combined at (*b*). The phase change gamma ($\gamma_1$) of the wave length lamba ($\lambda$) along path 1 is defined as $$\gamma_1 = 2\pi \int_1 \frac{dl}{\lambda} \qquad (1)$$

Similarly, the phase change $\gamma_2$ of the wave of wave length along the path 2 is defined as $$\gamma_2 = 2\pi \int_2 \frac{dl}{\lambda} \qquad (2)$$

The difference in phase at the point of juncture of the two waves approaching along paths 1 and 2 is denoted $\Delta\gamma$ and may be defined by the expression $$\Delta\gamma = 2\pi\left[\int_1 \frac{dl}{\lambda} - \int_2 \frac{dl}{\lambda}\right] \qquad (3)$$

Expression 3 is obtained by subtracting Equation 2 from Equation 1 and may be replaced by its full mathematical expression $$\Delta\gamma = 2\pi \oint \frac{dl}{\lambda} \qquad (4)$$

where the line integral is taken around the combined path 1, 2. The wave travelling along each of these paths also oscillates in time with a frequency nu ($\nu$) and the phase has also progressed with time as defined by the expression $$2\pi \int \nu dt \qquad (5)$$

Thus, the total phase difference is $$\Delta\gamma = 2\pi\left[\oint \frac{dl}{\lambda} + \int_1 \nu dt - \int_2 \nu dt\right] \qquad (6)$$

The amplitude (I) of the wave resulting from the combination of the two waves from paths 1 and 2 must depend upon cos $\Delta\gamma$. Thus $$I = I_0 \cos 2\pi\left[\oint \frac{dl}{\lambda} + \int_1 \nu dt - \int_2 \nu dt\right] \qquad (7)$$

This discussion has been concerned only with pure wave properties and it should apply generally to any wave form. We are here particularly interested in the application to the quantum waves or the De Broglie waves associated with particles. Specifically the wave length $\lambda$ is associated with the momentum $\rho$ by the expression $$\frac{1}{\lambda} = \frac{\rho}{h} \qquad (8)$$

where $h$ is Planck's constant. Similarly, the frequency is associated with energy (E) by the expression $$\nu = \frac{E}{h} \qquad (9)$$

For the De Broglie waves then $$I = I_0 \cos \frac{1}{h}\left[\oint \rho dl + \int_1 E dt - \int_2 E dt\right] \qquad (10)$$

where the amplitude I is now the current strength. Thus a control of the current I is possible through the modulation applied to $\oint \rho dl$ or $\int E dt$.

Such a modulation is a pure "quantum" effect and is not to be predicted from a classical view of matter. This becomes apparent when it is considered that any normally conductive wire arranged as shown in FIGURE 1 certainly does not exhibit such a modulation effect. In such a conductor the quantum waves are scattered frequently in the normally conductive wire giving rise to the normal resistance of the wire and causing a smearing of the quantum effect into unobservable chaos. Only in a super-conductor where there is no resistance and no phase destroying scattering can the quantum effect be observed. However, the nature of a super-conductor is such that the summation of the energies in path 1 and path 2 are identical in the absence of resistance. This is expressed mathematically as $$\int_1 Edt = \int_2 Edt \qquad (11)$$

and $$\oint \rho dl = Nh = \text{a constant number} \qquad (12)$$

From this it follows that I equals $I_0$ and no modulation is possible.

Figure 2:
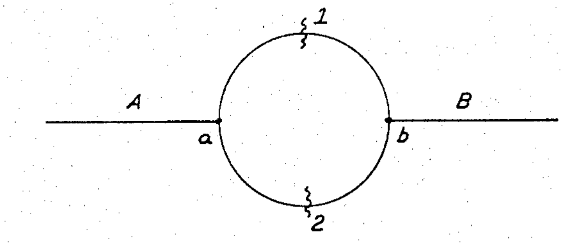
FIGURE 2 is a similar schematic showing with a junction in each branch.

The modulation of electron flow or electrical current has been made possible by the insertion of a junction or junctions in the circuit originally depicted in FIGURE 1 as shown in FIGURE 2. FIGURE 2 is identical to FIGURE 1 except that junctions as represented have been inserted into path 1 and path 2. These junctions are constructed so as to permit the passage of super-currents and to simultaneously permit expression (12) to be modified as follows $$\oint \rho dl \neq Nh \qquad (13)$$

Under these circumstances an energy difference ($\Delta$E) must develop across either or both junctions and the resultant super-current will be $$I = I_0 \cos \hbar[\oint \rho dl - \int \Delta E dt] \qquad (14)$$

The cannonical momentum ($\rho$) is composed of a mechanical momentum ($mv$) and an electromagnetic component ($e$A). If the energy represented by $\Delta$E is assumed but not restricted to be associated with a voltage (V), then the current may be written in full as follows $$I = I_0 \cos \hbar[\oint mvdl + e\oint Adl - e\int Vdt] \qquad (15)$$

The expression $\oint Adl$ is defined as the magnetic flux ($\phi$). From expression (15) it follows that current is explicitly seen to be modulated by (1) a particle velocity ($v$)
(2) a magnetic flux ($\phi$)
(3) a voltage (V).

Modulation by each of these techniques has been observed in laboratory demonstrations. The junctions employed in these demonstrations have included typical Josephson junctions which are essentially a thin insulating film barrier as well as a junction formed by a very narrow superconducting link.

The second term within the brackets in expression (15) may also be written as $e\phi$ and the expression (15) so requires that modulation of the super-current be obtainable by variation of the magnetic flux across the junction or junctions. Precisely this effect has been obtained experimentally using the interferometer shown schematically in FIGURE 2.

Figure 3:
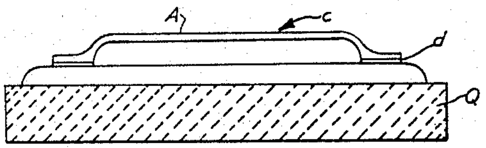
FIGURE 3 is an enlarged section of a specific type of junction structure.

The interferometer shown in section in FIGURE 3 was fabricated by evaporating a thin layer of tin ($d$) about 1000 angstroms thick upon a quartz substrate (Q). The surface of this tin layer was oxidized in a gently heated oxygen atmosphere to produce a layer of tin oxide upon tin layer $d$. The central portion of tin layer $d$ was covered with a suitable insulating coating. In this case a coating known commercially as "formvar" was employed. The "formvar" layer has been designated A. A second tin layer $c$ was now evaporated over "formvar" layer A and oxidized tin layer $d$. The two tin layers $c$ and $d$ form the two arms 1 and 2 of the device shown in FIGURE 2. Current is fed through this device by wires attached to films $c$ and $d$. The tin oxide layers act as the junctions.

This device was cooled in liquid helium to render the tin super-conductive and the device was then subjected to a varying magnetic flux. When the maximum super-current permitted through this device is graphed against the flux density, the curve obtained is that represented by FIGURE 4. This graph clearly shows the flux period of $$h/e = 2.07 \times 10^{-7} \text{ gauss/cm.}^2$$

Figure 4:
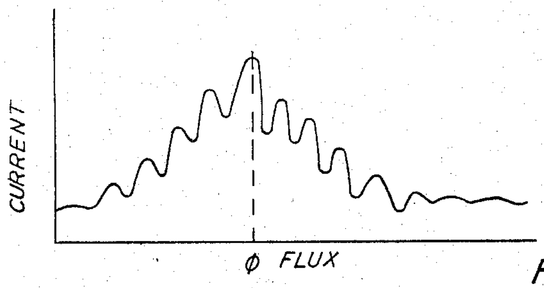
FIGURE 4 is a graph of magnetic flux against maximum super-current.

This flux period appears to be perfectly general and is common to all super-conductors which have been tested. The overall amplitude modulation of the super-current arises from a diffraction effect associated with the junctions themselves and is irrelevant to the establishment of the interference effect. The particular wave form displayed in FIGURE 4 is attributable to the characteristics of the particular experimental apparatus employed and is by no means to be construed as a limitation upon the type of modulation obtainable by this technique.

The first term enclosed in the brackets in expression (15) involves a velocity term and dictates that current modulation by means of velocity must be possible. The velocity modulation for a rotation ($\omega$) reduces to $$\frac{2M}{\hbar} A\omega$$

upon evaluating the integral. Expression (15) is thus an explicit function of the angular velocity and a periodic super-current modulation is expected as a function of the angular rotation rate similar to that described above with reference to flux modulation. Complete experimental confirmation has been obtained of this prediction. The interferometer depicted in FIGURE 3 was rotated about an axis perpendicular to area A. The predicted periodic modulation of super-currents introduced into this interferometer was obtained.

The final term within the brackets of expression (15) dictates that a time dependent modulation of current due to a voltage be obtainable. If any alternating voltage of frequency $\omega$ is impressed and is of the form $$V_0 \sin \omega t$$

the super-current of this frequency may be calculated to be of the form $$I = I_0 J_1\left(\frac{eV_0}{\hbar\omega}\right)$$

where $J_1$ is a Bessel function. This prediction has also received complete experimental confirmation.

Figure 5:
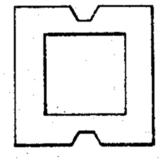
FIGURE 5 is a schematic showing of a further type of junction.

An interferometer was fabricated by evaporating a tin film about 1000 angstroms thick upon a quartz substrate. This evaporated tin film was then sculptured into the form shown in plan in FIGURE 5. The reduced sections of the tin layer form junctions when driven from the superconductive state to the normal state by an impressed current. The dimensions of the reduced section of the tin layer was 10 microns by 10 microns by 1000 angstroms.

This interferometer was chilled to the super-conductive temperature region and placed in the cavity of a micro wave apparatus. Here the micro waves induced super-currents through the interferometer. When these induced currents attain a sufficiently large value they induce a breakdown of the thin sections to create junctions. Interference now occurs with the super-currents being modulated by the microwave voltage appearing across the junctions.

Figure 6:
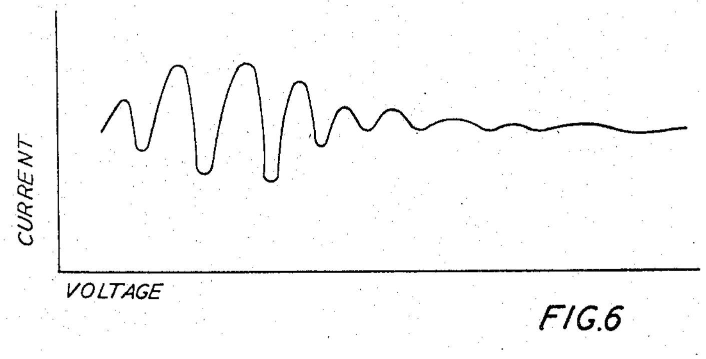
FIGURE 6 is a graph of voltage against super-current where voltage is employed to modulate the super-current.

A graph of current against voltage obtained in this manner is shown in FIGURE 6 and is typical of a Bessel function.

Figure 7:
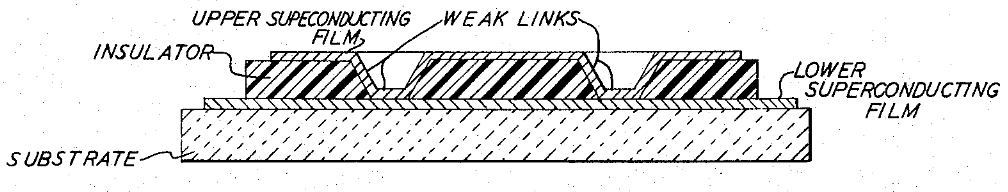
FIGURE 7 is an enlarged cross sectional view of a specific form of junction with which this invention is particularly concerned.

FIGURE 7 depicts the structure with which this invention is specifically concerned. This figure shows a particular form of junction which is readily fabricated from materials easily available and with reasonably simple techniques. This junction or circuit element was fabricated by evaporating a thin film. The film could be of any superconducting material and its thickness could be any value. This film was then painted with an insulating film about $10^{-4}$ cm. thick made of Formvar or of parlodin. Approximately $10^{-3}$ cm. diameter holes in the insulating film which exposed the tin layer were made mechanically using a dull (approximately $10^{-3}$ cm. diameter point) sewing needle. Other more sophisticated methods of hole production using electron beams, laser beams or electric sparks could also be used. In order to tell that the insulating film had been punctured a meter which measured the electrical resistance between the lower tin film and the needle used for puncturing was utilized. Best results were obtained if the appearance of an approximately 10-ohm resistance between the film and needle was taken to define the completion of the puncture. The use of a very sharp needle for puncturing was found to be unsatisfactory because little control could be exercised over the resistance between the point and the lower film and because it appeared that the insulating film healed itself if the puncture was too small. Once the holes had been formed, another layer of tin metal, or any other superconductor, was evaporated on top of the insulating film and over the sides and bottom of the holes. In this way the upper and lower films became connected by a thin cylindrical sheath whose thickness is the same as the thickness of the upper film. These thin cylindrical sheaths form the weak electrical links or junctions connecting the upper and lower superconducting films. The area enclosed by the superconducting films and links which controls the response of the device to magnetic fields is determined by the thickness of the insulating film and the distance between the links.

A further method of producing these junctions or weak links may be detailed as follows. In this case, the top and bottom superconducting films and the interposed insulating layer were prepared before any mechanical hole punching was done. After the entire sandwich was prepared, the dull needle was used to crush the insulating film locally and mechanically drive the top evaporated layer into electrical contact with the lower evaporated layer.

A further variation of this method of preparing junctions follows. This involves taking a thin insulating sheet like Mylar or mica and mechanically or electrically making small holes in it at the locations where weak links are desired. This insulating sheet is then used as the substrate and thin films of superconducting metals are evaporated on both sides of the sheet. During evaporation the walls of the holes also receive evaporated metal and electrical contact is established between the two surface films at the holes.

We claim as our invention:

1. An electrical junction comprising a supporting substrate, a lower superconducting element supported upon the supporting substrate, a perforated insulating layer supported upon said lower superconducting element and an upper superconducting layer supported upon said perforated insulating layer, said upper superconducting layer extending through said perforated insulating layer and contacting said lower superconducting element.

2. An electrical junction comprising a superconducting element, a perforated insulating layer supported upon said superconducting element and a second superconducting element supported upon said perforated insulating layer, said second superconducting element extending through said perforated insulating layer and contacting said first mentioned superconducting element.

3. An electrical junction comprising a superconducting element, a finely perforated insulating layer supported upon said superconducting element and an evaporated superconducting element supported upon said finely perforated insulating layer, said evaporated superconducting element extending through said finely perforated insulating layer and contacting said superconducting element.

References Cited

UNITED STATES PATENTS

| | | | |
|---|---|---|---|
| 2,983,889 | 5/1961 | Green | 338—32 |
| 3,257,587 | 6/1966 | Krafft | 338—32 |
| 3,259,866 | 7/1966 | Miles et al. | 338—32 |
| 3,302,152 | 1/1967 | Wine | 338—32 |

OTHER REFERENCES

"Thin Film Insulation in Superconducting Systems," by N. H. Meyers, IBM Technical Disclosure Bulletin, vol. 4, No. 7, December 1964, p. 94.

RICHARD M. WOOD, *Primary Examiner.*

W. BROOKS, *Assistant Examiner.*